(12) United States Patent
Banba et al.

(10) Patent No.: US 6,613,699 B2
(45) Date of Patent: Sep. 2, 2003

(54) PROCESS FOR PRODUCING A SEMICONDUCTOR DEVICE

(75) Inventors: Toshio Banba, Utsunomiya (JP); Takashi Hirano, Utsunomiya (JP); Masahide Shinohara, Tokyo (JP)

(73) Assignees: Sumitomo Bakelite Company Limited, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/035,325

(22) Filed: Jan. 4, 2002

(65) Prior Publication Data

US 2003/0036292 A1 Feb. 20, 2003

(30) Foreign Application Priority Data

Jan. 5, 2001 (JP) ............................... 2001-000828

(51) Int. Cl.[7] .................................................. H01L 21/31
(52) U.S. Cl. ........................ 438/780; 438/761; 438/778
(58) Field of Search .................................. 438/780, 758, 438/763, 778, 781, 791, 761

(56) References Cited

U.S. PATENT DOCUMENTS

| 4,965,134 A | * | 10/1990 | Ahne et al. | ............... 428/411.1 |
|---|---|---|---|---|
| 5,208,066 A | * | 5/1993 | Fujisaki et al. | ................ 427/96 |
| 5,731,243 A | * | 3/1998 | Peng et al. | .................. 438/612 |
| 6,235,436 B1 | * | 5/2001 | Hirano et al. | .................. 430/18 |
| 6,268,279 B1 | * | 7/2001 | Okada | ......................... 438/624 |
| 6,342,455 B2 | * | 1/2002 | Carter et al. | ................. 438/781 |

FOREIGN PATENT DOCUMENTS

JP       1-46862       10/1989

* cited by examiner

*Primary Examiner*—Kamand Cuneo
*Assistant Examiner*—Scott B. Geyer
(74) *Attorney, Agent, or Firm*—Smith, Gambrell & Russell, LLP

(57) ABSTRACT

A process for producing a semiconductor device which comprises forming a layer of an organic polymer resin on a surface of a semiconductor element, treating the formed layer by pattern working and curing, etching the element using the patterned and cured layer as a mask, exposing an electric conductive layer at open portions, treating the element with oxygen plasma at a temperature of 100° C. or higher and cleaning the electric conductive layer at the open portions.

When the electric conductive layer at open portions is cleaned by the oxygen plasma treatment, formation of cracks on the organic protective layer is suppressed and adhesion between the organic protective layer and a sealing resin is improved.

3 Claims, 1 Drawing Sheet

PROCESS FOR PRODUCING A SEMICONDUCTOR DEVICE

BACKGROUND OF THE INVENTION

1. Field of the Invention

The present invention relates to a process for producing a semiconductor device. More particularly, the present invention relates to a process for producing a semiconductor device which comprises, in a process comprising forming a pattern of an organic polymer resin as an organic protective film on the surface of a semiconductor element and cleaning an electric conductive layer at open portions of the pattern by the oxygen plasma treatment, adjusting the temperature of the oxygen plasma treatment at 100° C. or higher so that formation of cracks is prevented by lowering the modulus of the organic protective layer and improving adhesion between the organic protective layer and a sealing resin.

2. Description of Related Art

Heretofore, as the protective film of the surface and the interlayer insulation film of a semiconductor element, polyimide resins having excellent heat resistance, electric properties and mechanical properties have been used. However, significant improvements in resistance to heating cycles and resistance to heat shock are required for these films as the semiconductor element is highly integrated and has a greater size, the package becomes thinner and smaller and the mounting on the surface is conducted by solder reflow. Therefore, a resin exhibiting more excellent performance is desired.

On the other hand, a technology for providing photosensitivity to a polyimide resin itself is attracting attention. For example, it is attempted that a photosensitive resin of the negative type comprising a constituting unit represented by formula [1]:

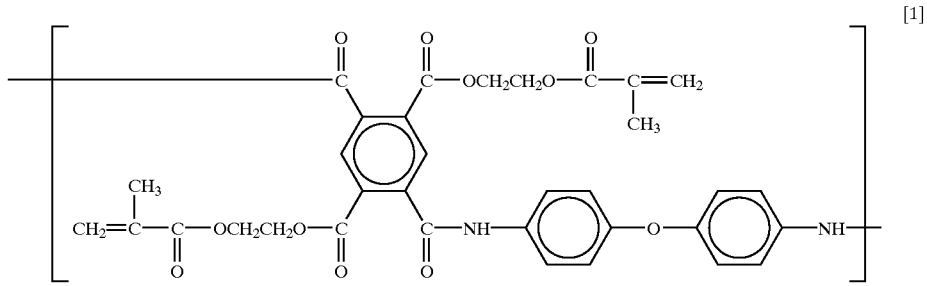

and a photosensitive resin of the positive type comprising a polybenzoxazole precursor and a compound having a quinone diazide group (Japanese Patent Application Publication Heisei 1(1989)-46862) are used.

When an organic polymer resin is used for a semiconductor device, in general, a layer of the organic polymer resin is disposed on the outermost surface of the semiconductor device, the disposed layer is treated by the pattern working and curing so that an organic protective film which is stable mechanically and formed under heating. An inorganic protective film such as a film of silicon oxide and a film of silicon nitride which coats an electric conductive layer at open portions is removed by etching so that the electric conductive layer (a bonding putt) is exposed and the exposed electric conductive layer is cleaned by the oxygen plasma treatment. However, in the above treatments, an undesirable phenomenon frequently takes place in that cracks are formed in the organic protective film during the oxygen plasma treatment due to dust (floating dusts) from the outside contaminating the organic protective film or at corner portions of steps on the surface of the semiconductor element.

A semiconductor device is, in general, used as a package. From the standpoint of the reliability of the semiconductor device, it is required that the semiconductor exhibit excellent adhesion with a sealing resin.

SUMMARY OF THE INVENTION

The present invention has an object of providing a process for producing a semiconductor device in which, when a pattern of an organic resin disposed on a semiconductor element is used as the organic protective film and an electric conductive layer at open portions is cleaned by the oxygen plasma treatment, formation of cracks on the organic protective film can be suppressed and adhesion between the organic protective film and the sealing resin is improved.

As the result of intensive studies by the present inventors to achieve the above object, it was found that, when the oxygen plasma treatment was conducted at a temperature of 100° C. or higher, the formation of cracks was suppressed since the modulus of the organic protective film can be reduced and the adhesion with the sealing resin could be improved. The present invention has been completed based on this knowledge.

The present invention provides:

(1) A process for producing a semiconductor device which comprises forming a layer of an organic polymer resin on a surface of a semiconductor element, treating the formed layer by pattern working and curing, etching the element using the patterned and cured layer as a mask to expose an electric conductive layer at open portions, treating the element with oxygen plasma at a temperature of 100° C. or higher and cleaning the electric conductive layer at the open portions;

(2) A process described in (1), wherein the oxygen plasma treatment of the semiconductor element is conducted at a temperature in a range of 150 to 250° C.;

(3) A process described in any of (1) and (2), wherein the layer of an organic polymer resin is a layer which comprises a photosensitive resin composition comprising at least one resin selected from the group consisting of polyimide precursor resins and polybenzoxazole precursor resins;

(4) A process described in (3) wherein the photosensitive resin is a photosensitive resin of a positive type comprising the polybenzoxazole precursor resin; and (5) A process described in (4), wherein the photosensitive resin is a photosensitive resin of a positive type comprising the polybenzoxazole precursor resin and a compound having a quinone diazide group.

BRIEF DESCRIPTION OF THE DRAWINGS

In FIG. 1(a), FIG. 1(b), FIG. 1(c) and FIG. 1(d), the numbers have the following meanings:

Figure 1A:
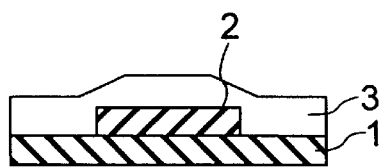
FIG. 1(a), FIG. 1(b), FIG. 1(c) and FIG. 1(d) show a process diagram exhibiting an embodiment of the process for producing a semiconductor device of the present invention.
Figure 1B:
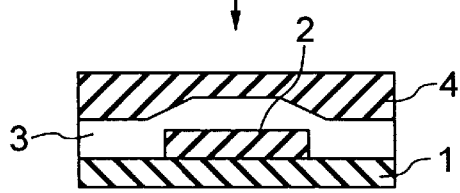

1: A semiconductor element
2: An electric conductive layer
3: An inorganic protective film
4: A layer of an organic polymer resin
4': A pattern of a cured organic polymer resin
5: An open portion

DESCRIPTION OF THE PREFERRED EMBODIMENTS

In the process of the present invention, examples of the resin composition used for the layer of an organic polymer resin formed on the surface of the semiconductor element include photosensitive resin compositions of the negative type which are obtained by introducing a photosensitive group into conventional polyimide precursor (polyamic acid) resins or polyamic acids which are not photosensitive through an ester bond or into polyimidic acids through an ionic bond, photosensitive resin compositions of the positive type which are obtained by adding a compound having quinone diazide group such as an ester of quinone diazide sulfonic acid to polybenzoxazole precursors, and photosensitive resin compositions of the positive type which are obtained by adding a compound having quinone diazide group such as an ester of quinone diazide sulfonic acid to polyimides of the closed ring type having a phenolic hydroxyl group.

Among these resin compositions, photosensitive resin compositions comprising at least one precursor resin selected from polyimide precursor resins and polybenzoxazole precursor resins are preferable due to a greater stress after curing. Photosensitive resin compositions of the positive type are more preferable. The photosensitive resin compositions of the positive type tend to exhibit a greater stress after curing due to a greater content of the compound having a quinone diazide group as the photosensitive group and, therefore, the effect of decreasing the modulus is greater.

Among the photosensitive resin compositions of the positive type, resin compositions comprising a polybenzoxazole precursor resin are preferable and resin compositions comprising a polybenzoxazole precursor resin and a compound having quinone diazide group are more preferable since the effect of excellent adhesion with a sealing resin can be exhibited in combination with the above effect of decreasing the modulus. Since hydroxyl group in the polybenzoxazole precursor is lost by curing, the improvement in the adhesion with the sealing resin can be remarkably exhibited after the treatment for moisture resistance.

Examples of the compound having quinone diazide group described above include products of complete esterification, partial esterification or amidation of aromatic compounds having one or more hydroxyl groups or amino groups with organic sulfonic acids having quinone diazide group such as naphthoquinone-1,2-diazide-5-sulfonic acid, naphthoquinone-1,2-diazide-4-sulfonic acid, ortho-benzoquinone diazide sulfonic acid and ortho-anthraquinone diazide sulfonic acid.

The process for producing the semiconductor device of the present invention will be described with reference to a figure in the following.

FIG. 1(a), FIG. 1(b), FIG. 1(c) and FIG. 1(d) show a process diagram exhibiting an embodiment of the process for producing semiconductor device of the present invention. In the process of the present invention, as shown in FIG. 1, a layer of the organic polymer resin 4 is formed on the surface of a semiconductor element 1 on which an electric conductive layer 2 such as aluminum wiring and an inorganic protective film 3 such as a film of silicon nitride and a film of silicon oxide are disposed.

The process for forming the layer of the organic polymer resin 4 is not particularly limited. For example, the semiconductor element is coated with a solution containing the organic polymer resin in accordance with a conventional process such as the rotation coating process using a spinner, the spray coating process using a spray coater, the dipping process, the printing process and the roll coating process. The coating layer is dried at a temperature in the range of about 60 to 130° C. and the layer of the organic polymer resin is formed. The thickness of the layer of the organic polymer resin is selected, in general, in the range of 5 to 20 $\mu$m and preferably in the range of 7 to 10 $\mu$m.

Figure 1C:
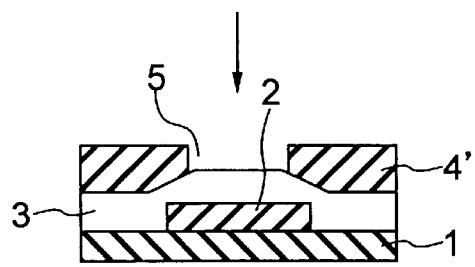
Figure 1D:
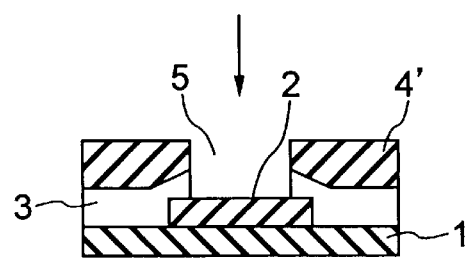

The layer of the organic polymer resin 4 formed as described above is treated by pattern working and then by curing [FIG. 1(c)].

The process for the pattern working is not particularly limited. For example, a film of a suitable photoresist is formed on the layer of the organic polymer resin comprising a polyimide precursor resin which is not photosensitive, treated by light exposure for image formation by irradiation with a suitably selected chemical ray and subjected to the development treatment. Then, the film of the photoresist is removed and a pattern of the organic polymer resin can be formed. In another example, the layer of the photosensitive resin composition described above is formed as the layer of an organic polymer resin, treated by the light exposure for image formation by irradiation with a suitably selected chemical ray and subjected to the development treatment and the prescribed pattern of the organic polymer resin can be formed. The second process is preferable.

Examples of the above chemical ray include X-ray, electron beams, ultraviolet light or visible light. A ray having a wavelength in the range of 200 to 500 nm is preferable. The development solution used in the development treatment in the second process is as follows. When a photosensitive resin composition of the positive type is used, an aqueous solution of an alkali or an aqueous solution of an alkali containing an organic solvent soluble in water such as an alcohol or a surfactant in a suitable amount can be used. Examples of the alkali include inorganic alkalis such as sodium hydroxide, potassium hydroxide, sodium silicate, sodium metasilicate and ammonia; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; and quaternary ammonium salts such as tetramethylammonium hydroxide and tetraethylammonium hydroxide. Examples of the alcohol include methanol and ethanol. When a photosensitive resin composition of the negative type is used, an organic solvent such as N-methylpyrrolidone and N,N-dimethylacetamide is used as the development solution.

As the process for the development, the spraying process, the paddling process or the dipping process can be used. The pattern of the organic polymer resin formed as described above is, in general, rinsed with a rinsing liquid such as pure water and treated by curing. The curing treatment can be conducted by heating at a temperature suitably selected in accordance with the type of the resin constituting the pattern of the organic polymer resin. The ring closure takes place in the resin constituting the pattern of the organic polymer resin by the heating and an organic protective film having excellent heat resistance can be obtained.

The etching treatment is conducted using the pattern of the cured organic polymer resin 4' formed as described above as the mask. The inorganic protective film 3 at an open portion 5 is removed and the electric conductive layer 2 is exposed. Then, the oxygen plasma treatment is conducted and the electric conductive layer 2 at the open portion 5 is cleaned [FIG. 1(d)].

As the process for the etching, the dry etching process is suitable. As the dry etching process, various processes may be used. Examples of the preferable process include the plasma etching process and the reactive ion etching process (the RIE process). In these processes, in general, a fluorine-based gas such as tetrafluoromethane is used as the etching gas. However, the type of the etching gas and the conditions of the etching can be suitably selected in accordance with the type of the inorganic protective film 3 which is etched. The electric conductive layer 2 at the open portion 5 is exposed by the etching treatment.

The electric conductive layer at the open portion is treated by ashing with oxygen plasma and cleaned. In the present invention, the oxygen plasma treatment is conducted at a temperature of 100° C. or higher.

In conventional processes, it is not preferable that the ashing by the oxygen plasma treatment is conducted at a high temperature since the thickness of the organic protective film which should work as the mask decreases markedly at a high temperature. Therefore, a mild low temperature condition such as the room temperature is used in conventional processes when the oxygen plasma treatment is conducted in the presence of an organic protective film.

However, in the process for producing a semiconductor device, it is inevitable that the organic polymer resin is contaminated with dust (floating dusts) and solid substances formed from tip portions of dispense nozzles due to drying during the use of the organic polymer resin. When the layer of the organic polymer resin contaminated with the dust and the solid substances is treated by the pattern working and the curing, stress is concentrated at portions having the dust and the solid substances due to shrinkage of the organic polymer resin by curing. The surface of a semiconductor device has portions of steps where the height varies discontinuously. Stress due to shrinkage of the organic polymer resin by curing is concentrated at protruded corner portions of the steps. When the oxygen plasma treatment is conducted in the presence of the organic protective film described above, cracks tend to be formed at the portions of stress concentration in the organic protective film.

In the present invention, the formation of cracks can be effectively suppressed by conducting the oxygen plasma treatment at a temperature of 100° C. or higher. Modulus of a cured film of an organic polymer resin decreases slowly as the temperature is raised and rapidly at the glass temperature (Tg). Therefore, the modulus of the protective film can be adjusted to a lower value and the stress is relaxed by conducting the oxygen plasma treatment at a temperature of 100° C. or higher and the formation of cracks is suppressed.

When the temperature of the oxygen plasma treatment is lower than 100° C., the effect of decreasing the modulus of the organic protective film is small and the object of the present invention is not sufficiently achieved. When the temperature of the oxygen plasma treatment is excessively high, the decrease in the thickness of the organic protective film markedly increases and controlling the thickness becomes difficult. From the standpoint of the decrease in the modulus of the organic protective film and the decrease in the thickness, it is preferable that the temperature of the oxygen plasma treatment is in the range of 150 to 250° C.

By conducting the treatment with oxygen plasma at a temperature of 100° C. or higher, adhesion between the organic protective film with a sealing resin can be improved. When the oxygen plasma treatment is conducted in the presence of an organic protective film, in general, the surface of the film becomes rough since the resin has a composition which is more easily etched at some portions of the surface of the film and a composition which is less easily etched at other portions. This phenomenon takes place in a greater degree when the oxygen plasma treatment is conducted at a high temperature and the roughness of the surface increases. As the result, the adhesion with the sealing resin is improved due to the anchor effect and reliability of the semiconductor device is improved remarkably.

The oxygen plasma treatment is conducted, in general, by using an ashing apparatus. As the ashing apparatus, an apparatus of the single-wafer processing system or an apparatus of the batch type can be used. The apparatus of the single-wafer processing system is preferable since the temperature of the treatment can be controlled more easily.

To summarize the advantages of the present invention, when the pattern of the organic polymer resin formed on the semiconductor element is used as the organic protective film and the cleaning of the electric conductive layer at open portions is conducted by the oxygen plasma treatment at a temperature of 100° C. or higher, the formation of cracks can be suppressed by decreasing the modulus of the organic protective layer and the semiconductor device having an improved adhesion between the organic protective layer and the sealing resin can be easily produced.

EXAMPLES

The present invention will be described more specifically with the following examples. However, the present invention is not limited to the examples.

Example 1

(1) Preparation of a Polybenzoxazole Precursor

In a four-necked flask equipped with a thermometer, a stirrer, an inlet for a raw material and an inlet for nitrogen gas, 258.2 g (1.0 moles) of (diphenyl ether)-4,4'-dicarboxylic acid and 270.3 g (2.0 moles) of 1-hydroxybenzotriazole were dissolved into 1,500.0 g of N-methyl-2-pyrrolidone. To the resultant solution, a solution prepared by dissolving 412.7 g (2.0 moles) of dicyclohexylcarbodiimide in 500.0 g of N-methyl-2-pyrrolidone was added dropwise while the reaction system was cooled at a temperature in the range of 0 to 5° C. After the addition was completed, the temperature of the reaction system was brought at the room temperature and the reaction system was stirred for 12 hours at the room temperature. After the reaction was completed, dicyclohexylcarbodiurea formed as precipitates was removed by filtration. To the obtained filtrate, 2,000.0 g of pure water was added dropwise. The formed precipitates were separated by filtration, washed sufficiently with isopropyl alcohol and dried in vacuo and an active ester (A) in which 2 moles of 1-hydroxybenzotriazole reacted at two end portions of diphenyl ether 4,4'-dicarboxylic acid was obtained.

Into 1,000.0 g of N-methyl-2-pyrrolidone, 147.7 g (0.3 moles) of the derivative of the dicarboxylic acid (A) obtained above and 120.9 g (0.33 moles) of hexafluoro-2,2-bis(3-amino-4-hydroxyphenyl)propane were dissolved. The temperature of the reaction system was adjusted at 75° C. and the reaction was allowed to proceed for 12 hours. To the obtained reaction mixture, a solution prepared by dissolving 11.5 g (0.07 moles) of 5-norbornene-2,3-dicarboxylic acid anhydride in 50.0 g of N-methyl-2-pyrrolidone was added and the reaction was allowed to proceed in the resultant reaction mixture for 12 hours. The obtained reaction mixture was added into a mixed solvent containing water and methanol in amounts such that ratio of the amounts by weight was 3/1. The formed precipitates were recovered, washed sufficiently with pure water and dried in vacuo and a polybenzoxazole precursor (P-1) was obtained.

(2) Preparation of a Photosensitive Resin Composition of the Positive Type

The polybenzoxazole precursor (P-1) prepared in (1) described above in an amount of 100 g and 25 g of a compound having quinone diazide group (Q-1) which is represented by formula [2]:

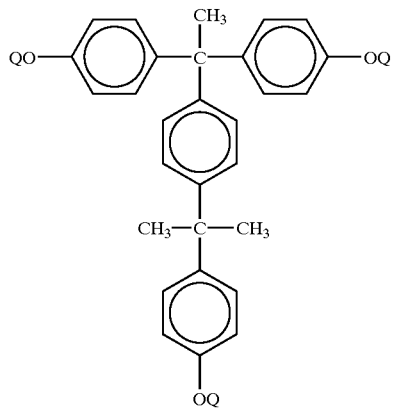

[2]

wherein Q represents a group represented by the following formula:

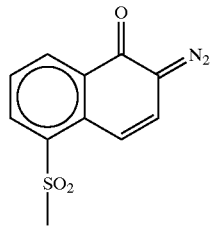

or hydrogen atom, 75% of the group and the atom represented by Q being the group represented by the above formula and 25% of the group and the atom represented by Q being hydrogen atom, were dissolved into 200 g of N-methyl-2-pyrrolidone. The obtained solution was filtered with a 0.2 μm Teflon filter and a photosensitive resin composition of the positive type (W-1) was prepared.

(3) Evaluation of the Crack Resistance in the Oxygen Plasma Treatment

Into the photosensitive resin composition of the positive type (W-1) prepared in (2) described above, 0.1% by weight of spherical silica having a diameter of 30 μm was uniformly mixed as a substance imitating floating dust. The surface of a semiconductor element was coated with the obtained composition using a spin coater. The coating layer was dried at 120° C. for 4 minutes on a hot plate and a resist film having a thickness of about 12 μm was formed. The formed resist film was exposed to light in an amount of 400 mJ/cm$^2$ from a g-ray stepper light exposer NSR-1505G3A (manufactured by NIKON Co., Ltd.) through a reticle.

After the exposed element was dipped into a 1.40% by weight aqueous solution of tetramethylammonium hydroxide for 40 seconds and the film at the exposed portion was removed by dissolution, the element was rinsed with pure water for 30 seconds. As the result, it was confirmed that a resist pattern was formed.

The wafer obtained above was heated in an oven under an atmosphere of nitrogen at 150° C. for 30 minutes and then at 320° C. for 30 minutes and the resist pattern was cured.

The wafer thus treated was placed into a dry etching apparatus [manufactured by TOKYO OKA Co., Ltd.] and the inorganic protective film (plasma SiN) was treated by the dry etching in $CF_4$ gas for 185 seconds.

The wafer treated by the dry etching was then treated with oxygen plasma for 3 minutes using a gas of 200 SCCM oxygen gas under the condition of a pressure of 2.4 Torr, a temperature of 200° C. and an output power of 400 W using an ashing apparatus OPM-EM1000 [manufactured by TOKYO OKA Co., Ltd.]. The surface of the resist pattern was observed and it was found that no cracks were formed and the decrease in the thickness was 0.66 μm.

(4) Evaluation of the Adhesion With a Sealing Resin

A silicone wafer was coated with the photosensitive resin composition of the positive type (W-1) prepared in (2) described above using a spin coater. The coating layer was dried at 120° C. for 4 minutes on a hot plate and a coating film having a thickness of about 12 μm was formed. The wafer obtained above was heated in an oven under an atmosphere of nitrogen at 150° C. for 30 minutes and then at 350° C. for 30 minutes and the coating film was cured.

The obtained wafer was treated by the dry etching with $CF_4$ and then with the oxygen plasma in accordance with the same procedures as those conducted in (3) described above.

The obtained wafer was cut into a chip having a size of 10×20 mm by a dicing saw. On the obtained chip, a layer of a sealing resin having a size of 2×2×2 mm and comprising an epoxy resin composition for sealing a semiconductor [manufactured by SUMITOMO BAKELITE Co., Ltd.; EME-7320] was formed. After the post cure at 185° C. for 8 hours, the pressure cooker treatment (PCT) was conducted under the condition of a temperature of 125° C. and a pressure of 23 atm for 24 hours. The layer of the sealing resin formed on the coating film was peeled by a TEN-SIRON and the shear strength was measured. The shear strength was found to be 3.7 kg/mm$^2$.

Example 2

(1) Preparation of a Polyimide of the Closed Ring Type Having Phenolic Hydroxyl Group In a four-necked flask equipped with a thermometer, a stirrer, an inlet for a raw material and an inlet for nitrogen gas, 292.5 g (0.80 moles) of hexafluoro-2,2-bis(3-amino-4-hydroxyphenyl)propane was dissolved into 1,200.0 g of N-methyl-2-pyrrolidone. To the resultant solution, 173.3 g (0.39 moles) of 4,4'-(hexafluoroisopropylidene)phthalic acid dianhydride and 125.7 g (0.39 moles) of 3,3',4,4'-benzophenonetetracarboxylic acid anhydride were added and the resultant mixture was stirred at the room temperature for 8 hours. A Dean Stark trap was attached to the flask as a condenser. To the mixture obtained above, 100 g of toluene was added and the reaction was allowed to proceed in the resultant mixture at 140° C. for 3 hours. The temperature was raised to 180 to 190° C. and the heating was continued for 30 minutes so that the azeotropic mixture of water and toluene was completely removed. After the reaction was completed, the temperature was lowered to the room temperature in a water bath and a varnish of a polyimide of the closed ring type having phenolic hydroxyl group (P-2) as the object compound was obtained.

(2) Preparation of a Photosensitive Resin Composition of the Positive Type

Into 500 g of the varnish of a polyimide (P-2) prepared in (1) described above, 40 g of the compound having quinone diazide group (Q-1) shown above was dissolved. The resultant solution was filtered with a 0.2 mm Teflon filter and a varnish of a photosensitive resin composition of the positive type (W-2) was prepared.

(3) Evaluation of the Crack Resistance in the Oxygen Plasma Treatment

Into the varnish of a photosensitive resin composition of the positive type (W-2) prepared in (2) described above, 0.1% by weight of spherical silica having a diameter of 30 $\mu$m was uniformly mixed as a substance imitating floating dusts. The surface of a semiconductor element was coated with the obtained composition using a spin coater. The coating layer was dried at 120° C. for 4 minutes on a hot plate and a resist film having a thickness of about 12 $\mu$m was formed. The formed resist film was exposed to light in an amount of 300 mJ/cm$^2$ from a g-ray stepper light exposer NSR-1505G3A [manufactured by NIKON Co., Ltd.] through a reticle.

The exposed element was dipped into a 2.38% by weight aqueous solution of tetramethylammonium hydroxide for 30 seconds and the film at the exposed portion was removed by dissolution. Then, the element was rinsed with pure water for 30 seconds. As the result, it was confirmed that a resist pattern was formed.

Thereafter, the resist pattern was cured and treated by the dry etching and with the oxygen plasma. The surface of the obtained resist pattern was observed and it was found that no cracks were formed and the decrease in the thickness was 0.73 $\mu$m.

(4) Evaluation of the Adhesion With a Sealing Resin

Using the varnish of a photosensitive resin composition of the positive type (W-2) prepared in (2) described above, a coating film having a thickness of about 10 mm was formed on a silicon wafer, cured and treated by the dry etching and with the oxygen plasma in accordance with the same procedures as those conducted in Example 1(4).

In accordance with the same procedures as those conducted in Example 1(4) except that the size of the chip was 10×10 mm, the shear strength in peeling of the layer of the sealing resin was measured and found to be 3.0 kg/mm$^2$.

Example 3

(1) Preparation of a Photosensitive Polyimide Precursor of the Ester Type

In a four-necked flask equipped with a thermometer, a stirrer, an inlet for a raw material and an inlet for nitrogen gas, 322.2 g (1.0 moles) of 3,3',4,4'-benzophenonetetracarboxylic acid dianhydride and 260.28 g (2.0 moles) of 2-hydroxyethyl methacrylate were suspended into 2,500 g of N-methyl-2-pyrrolidone. To the resultant suspension, 166.1 g (2.1 moles) of pyridine was added and the reaction was allowed to proceed at 25° C. for 10 hours. To the resultant reaction mixture, 270.2 g (2.0 moles) of 1-hydroxy-1,2,3-benzotriazole was added and completely dissolved in 1 hour. To the obtained mixture, a solution prepared by dissolving 412.6 g (2.0 moles) of dicyclohexylcarbodiimide in 400.0 g of N-methyl-2-pyrrolidone was added dropwise over 20 minutes while the reaction system was kept at a temperature of 10° C. or lower. After the addition was completed, the reaction was allowed to proceed at 25° C. for 3 hours. To the reaction mixture, 190.2 g (0.95 moles) of 4,4'-diaminodiphenyl ether was added and the reaction was allowed to proceed at 30° C. for 5 hours. After the reaction was completed, dicyclohexylcarbodiurea was removed by filtration. The reaction mixture was then recrystallized from methanol. The formed solid substance was separated by filtration, washed with methanol and dried under a reduced pressure for 48 hours and a photosensitive polyimide precursor of the ester type (P-3) as the object compound was obtained.

(2) Preparation of a Photosensitive Resin Composition

The varnish of a polyimide (P-3) prepared in (1) described above in an amount of 100 g was dissolved into 200 g of N-methyl-2-pyrrolidone. To the resultant solution, 0.1 g of methyl ether hydroquinone, 5 g of N-phenylglycine, 1 g of 1-phenyl-5-mercapto-1H-tetrazole, 0.5 g of 3-(2-benzimidazolyl)-7-diethylaminocoumarine and 10 g of tetraethylene glycol dimethacrylate were added. The resultant mixture was filtered with a 0.2 mm Teflon filter and a varnish of a photosensitive resin composition (W-3) was prepared.

(3) Evaluation of the Crack Resistance in the Oxygen Plasma Treatment

Into the varnish of a photosensitive resin composition (W-3) prepared in (2) described above, 0.1% by weight of spherical silica having a diameter of 30 $\mu$m was uniformly mixed as a substance imitating floating dusts. The surface of a semiconductor element was coated with the obtained composition using a spin coater. The coating layer was dried at 100° C. for 4 minutes on a hot plate and a resist film having a thickness of about 12 $\mu$m was formed. The formed resist film was exposed to light in an amount of 300 mJ/cm$^2$ from a g-ray stepper light exposer NSR-1505G3A [manufactured by NIKON Co., Ltd.] through a reticle.

The development was conducted using cyclopentanone as the developing solvent and the developed element was rinsed with propylene glycol methyl ether acetate. The remaining fraction of the thickness of the film was 90.2% and, as the result, it was confirmed that a resist pattern was formed.

Thereafter, the resist pattern was cured and treated by the dry etching and with the oxygen plasma in accordance with the same procedures as those conducted in Example 1(3). The surface of the obtained resist pattern was observed and it was found that no cracks were formed and the decrease in the thickness was 0.56 $\mu$m.

(4) Evaluation of the Adhesion With a Sealing Resin

The surface of a silicon wafer was coated with the varnish of a photosensitive resin composition (W-3) prepared in (2) described above using a spin coater. After drying on a hot plate at 100° C. for 4 minutes, a coating film having a thickness of about 12 $\mu$m was formed.

In accordance with the same procedures as those conducted in Example 1(4), the coating film was cured and treated by the dry etching and with the oxygen plasma. The shear strength in peeling of the layer of the sealing resin was measured and found to be 2.3 kg/mm$^2$.

Example 4

In a four-necked flask equipped with a thermometer, a stirrer, an inlet for a raw material and an inlet for nitrogen gas, 200.2 g (1.00 mole) of 4,4'-diaminodiphenyl ether and 12.4 g (0.05 moles) of 1,3-bis(3-aminopropyl)-1,1,3,3-tetramethyldisiloxane were dissolved into 2,441 g of N-methyl-2-pyrrolidone. To the resultant solution, 218.1 g (1.00 mole) of pyromellitic acid dianhydride was added while the solution was kept at a temperature of 20° C. or lower by cooling with ice. The reaction was allowed to proceed for 5 hours and a varnish of a polyamic acid (P-4) of the object compound was obtained.

(2) Preparation of a Resin Composition

The varnish of a polyamic acid (P-4) prepared in (1) described above was filtered with a 0.2 μm filter and a varnish of a resin composition (W-4) was prepared.

(3) Evaluation of the Crack Resistance in the Oxygen Plasma Treatment

Into the varnish of a photosensitive resin composition (W-4) prepared in (2) described above, 0.1% by weight of spherical silica having a diameter of 30 μm was uniformly mixed as a substance imitating floating dusts. The surface of a semiconductor element was coated with the obtained composition using a spin coater. The coating layer was dried at 135° C. for 1 minute on a hot plate and a coating film having a thickness of about 10 μm was formed. Then, the above coating film was coated with a resist of the positive type [OFPR-800; manufactured by TOKYO OKA Co., Ltd.] and the formed resist film was exposed to light in an amount of 300 mJ/cm$^2$ from a g-ray stepper light exposer NSR-1505G3A [manufactured by NIKON Co., Ltd.] through a reticle.

The exposed element was dipped into a 2.38% by weight aqueous solution of tetramethylammonium hydroxide for 45 seconds and the film at the exposed portion was removed by dissolution. The element was then rinsed with pure water for 30 seconds and the above resist film was removed with butyl acetate.

The wafer obtained above was heated in an oven under an atmosphere of nitrogen at 150° C. for 30 minutes and then at 320° C. for 30 minutes and the coating film was cured.

Thereafter, the wafer was treated by the dry etching and with the oxygen plasma in accordance with the same procedures as those conducted in Example 1(3). The surface of the obtained resist pattern was observed and it was found that no cracks were formed and the decrease in the thickness was 0.34 μm.

(4) Evaluation of the Adhesion With a Sealing Resin

A silicon wafer was coated with the varnish of a resin composition (W-4) prepared in (2) described above using a spin coater. The formed coating layer was dried on a hot plate at 135° C. for 1 minute and a coating film have a thickness of about 10 μm was formed. The formed coating film was cured by heating under an atmosphere of nitrogen at 150° C. for 30 minutes and at 350° C. for 30 minutes.

The obtained wafer was treated by the dry etching with $CF_4$ and with the oxygen plasma in accordance the same procedures as those conducted in Example 1(3).

In accordance with the same procedures as those conducted in Example 1(4) except that the size of the chip was 10×10 mm, the shear strength in peeling of the layer of the sealing resin was measured and found to be 2.3 kg/mm$^2$.

Example 5

The same procedures as those conducted in Example 1 were conducted except that the oxygen plasma treatment was conducted at a temperature of 150° C. with an output power of 400 W for 3 minutes in (3) Evaluation of the crack resistance in the oxygen plasma treatment and (4) Evaluation of the adhesion with a sealing resin. The results are shown in Table 1 together with the condition of the oxygen plasma treatment. The results of the oxygen plasma treatments in Examples 1 to 4 are also shown in Table 1.

Example 6

The same procedures as those conducted in Example 1 were conducted except that the oxygen plasma treatment was conducted at a temperature of 150° C. with an output power of 400 W for 5 minutes in (3) Evaluation of the crack resistance in the oxygen plasma treatment and (4) Evaluation of the adhesion with a sealing resin. The results are shown in Table 1 together with the condition of the oxygen plasma treatment.

Example 7

The same procedures as those conducted in Example 1 were conducted except that the oxygen plasma treatment was conducted at a temperature of 250° C. with an output power of 400 W for 2 minutes in (3) Evaluation of the crack resistance in the oxygen plasma treatment and (4) Evaluation of the adhesion with a sealing resin. The results are shown in Table 1 together with the condition of the oxygen plasma treatment.

Example 8

The same procedures as those conducted in Example 1 were conducted except that the oxygen plasma treatment was conducted at a temperature of 200° C. with an output power of 800 W for 1 minute in (3) Evaluation of the crack resistance in the oxygen plasma treatment and (4) Evaluation of the adhesion with a sealing resin. The results are shown in Table 1 together with the condition of the oxygen plasma treatment.

Example 9

The same procedures as those conducted in Example 1 were conducted except that the oxygen plasma treatment was conducted at a temperature of 100° C. with an output power of 400 W for 7 minute in (3) Evaluation of the crack resistance in the oxygen plasma treatment and (4) Evaluation of the adhesion with a sealing resin. The results are shown in Table 1 together with the condition of the oxygen plasma treatment.

Example 10

The same procedures as those conducted in Example 1 were conducted except that the oxygen plasma treatment was conducted at a temperature of 300° C. with an output power of 400 W for 1 minute in (3) Evaluation of the crack resistance in the oxygen plasma treatment and (4) Evaluation of the adhesion with a sealing resin. The results are shown in Table 1 together with the condition of the oxygen plasma treatment.

Comparative Example 1

The same procedures as those conducted in Example 1 were conducted except that the oxygen plasma treatment was conducted at a temperature of 25° C. with an output power of 400 W for 10 minutes in (3) Evaluation of the crack resistance in the oxygen plasma treatment and (4) Evaluation of the adhesion with a sealing resin. The results are shown in Table 1 together with the condition of the oxygen plasma treatment.

Comparative Example 2

The same procedures as those conducted in Example 2 were conducted except that the oxygen plasma treatment was conducted at a temperature of 25° C. with an output power of 400 W for 10 minutes in (3) Evaluation of the crack resistance in the oxygen plasma treatment and (4) Evaluation of the adhesion with a sealing resin. The results are shown in Table 1 together with the condition of the oxygen plasma treatment.

Comparative Example 3

The same procedures as those conducted in Example 3 were conducted except that the oxygen plasma treatment was conducted at a temperature of 25° C. with an output power of 400 W for 10 minutes in (3) Evaluation of the crack resistance in the oxygen plasma treatment and (4) Evaluation of the adhesion with a sealing resin. The results are shown in Table 1 together with the condition of the oxygen plasma treatment.

Comparative Example 4

The same procedures as those conducted in Example 1 were conducted except that the oxygen plasma treatment was conducted at a temperature of 25° C. with an output power of 400 W for 3 minutes in (3) Evaluation of the crack resistance in the oxygen plasma treatment and (4) Evaluation of the adhesion with a sealing resin. The results are shown in Table 1 together with the condition of the oxygen plasma treatment.

TABLE 1

| | Condition of oxygen plasma treatment | | | | Results | | |
|---|---|---|---|---|---|---|---|
| | temperature (° C.) | | output power | time | decrease in thickness | number of | shear strength |
| | start | end | (W) | (min) | ($\mu$m) | cracks | (kg/mm$^2$) |
| Example 1 | 200 | 200 | 400 | 3 | 0.66 | 0 | 3.7 |
| Example 2 | 200 | 200 | 400 | 3 | 0.73 | 0 | 3.0 |
| Example 3 | 200 | 200 | 400 | 3 | 0.56 | 0 | 2.3 |
| Example 4 | 200 | 200 | 400 | 3 | 0.34 | 0 | 2.3 |
| Example 5 | 150 | 150 | 400 | 3 | 0.49 | 0 | 3.6 |
| Example 6 | 150 | 150 | 400 | 5 | 0.63 | 0 | 3.5 |
| Example 7 | 250 | 250 | 400 | 2 | 0.61 | 0 | 3.6 |
| Example 8 | 200 | 200 | 800 | 1 | 0.72 | 0 | 3.7 |
| Example 9 | 100 | 100 | 400 | 7 | 0.68 | 1 | 3.6 |
| Example 10 | 300 | 300 | 400 | 1 | 1.25 | 0 | 3.3 |
| Comparative Example 1 | 25 | 55* | 400 | 10 | 0.65 | 47 | 3.4 |
| Comparative Example 2 | 25 | 55* | 400 | 10 | 0.71 | 35 | 2.6 |
| Comparative Example 3 | 25 | 55* | 400 | 10 | 0.59 | 48 | 1.8 |
| Comparative Example 4 | 25 | 55* | 400 | 3 | 0.14 | 25 | 3.5 |

*An increase in the temperature due to heat generation during the oxygen plasma treatment.

What is claimed is:

1. A process for producing a semiconductor device having a layer of an organic protective film formed on the surface of the device, the process comprising forming a layer of an organic polymer resin, which organic polymer resin comprises a photosensitive resin composition comprising at least one resin selected from the group consisting of polyimide precursor resins and polybenzoxazole precursor resins on a surface of an inorganic protective film, which inorganic protective film is deposited on an electrically conductive layer which is disposed on said semiconductor device, treating said layer of the organic polymer by pattern working and curing to form a cured organic protective film on said inorganic protective film, etching the inorganic protective film using the cured organic film layer as a mask to expose an electrically conductive layer at open portions, treating the electrically conductive layer with oxygen plasma at a temperature in the range of 150–250° C. and cleaning the electrically conductive layer at the open portions.

2. A process according to claim 1, wherein the photosensitive resin is a photosensitive resin of a positive type comprising the polybenzoxazole precursor resin.

3. A process according to claim 2, wherein the photosensitive resin is a photosensitive resin of a positive type comprising the polybenzoxazole precursor resin and a compound having a quinone diazide group.

* * * * *